(12) United States Patent
Fujimura

(10) Patent No.: US 6,255,132 B1
(45) Date of Patent: Jul. 3, 2001

(54) METHOD OF LINING UP MICRO-BALLS

(75) Inventor: Naoyuki Fujimura, Tokyo (JP)

(73) Assignee: Ando Electric Co., Ltd., Tokyo (JP)

( * ) Notice: Subject to any disclaimer, the term of this patent is extended or adjusted under 35 U.S.C. 154(b) by 0 days.

(21) Appl. No.: 09/510,774

(22) Filed: Feb. 23, 2000

(30) Foreign Application Priority Data

Feb. 26, 1999 (JP) .................................................. 11-051947

(51) Int. Cl.[7] .................................................. H01L 21/00
(52) U.S. Cl. ................................ 438/48; 438/22; 438/25; 438/55; 257/678; 257/738
(58) Field of Search .................. 438/48, 22, 25, 438/55, 106; 257/723, 738, 678

(56) References Cited

FOREIGN PATENT DOCUMENTS

| H7-153765 | 6/1995 | (JP) . |
| H7-153766 | 6/1995 | (JP) . |
| 10-335338 | * 12/1998 | (JP) .............................. H01L/21/321 |

* cited by examiner

*Primary Examiner*—Charles Bowers
*Assistant Examiner*—Hsien-Ming Lee
(74) *Attorney, Agent, or Firm*—Flynn, Thiel, Boutell & Tanis, P.C.

(57) ABSTRACT

A method of lining up micro-balls on an arraying jig includes removing an excess of the micro-balls located thereat with ease. The micro-balls are supplied onto the arraying jig having a plurality of array holes formed therein. A cylindrical body is disposed above the arraying jig, and the micro-balls are maintained at the array holes by an air vacuum through the array holes of the arraying jig. A standing wave having nodes formed concentrically is generated inside the cylindrical body by subjecting the cylindrical body to ultrasonic vibration, so that the micro-balls are concentrated at the nodes of the standing wave. By moving the cylindrical body horizontally over the arraying jig while maintaining the ultrasonic vibration, the micro-balls are distributed into the respective array holes. By weakening a suction force acting through the array holes and subjecting the cylindrical body to ultrasonic vibration while moving the cylindrical body horizontally over the arraying jig, the excess of the micro-balls at the top of the arraying jig is concentrated at the nodes of the standing wave, and then is removed.

17 Claims, 14 Drawing Sheets

FIG. 14 (PRIOR ART)
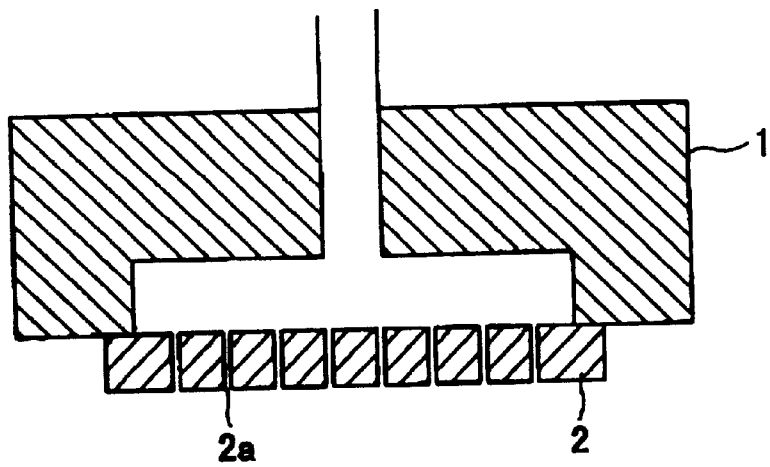
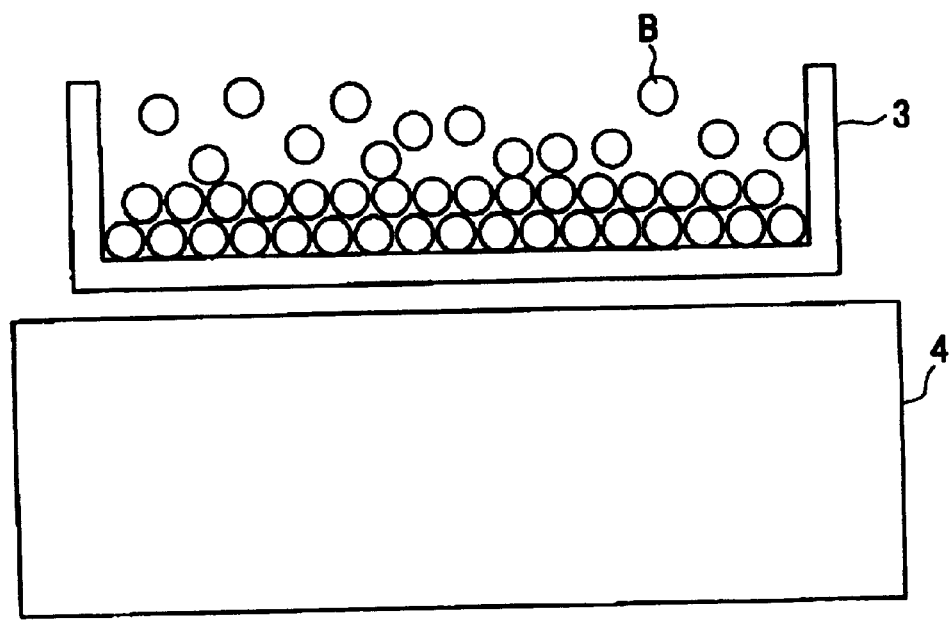

METHOD OF LINING UP MICRO-BALLS

BACKGROUND OF THE INVENTION

1. Field of the Invention

The present invention relates to a method of lining up or positioning micro-balls on a jig, the micro-balls to be formed into bumps disposed on a work for a substrate, chip, or so forth, in a micro-ball mounting apparatus of a semiconductor device manufacturing system, and particularly, to a method of lining up micro-balls on an arraying jig by feeding the micro-balls into array holes on the arraying jig having a plurality of the array holes.

2. Description of the Related Art There has already been disclosed in Japanese Patent Laid-Open No. H7-153765, and Japanese Patent Laid-Open No. H7-153766 a micro-ball mounting apparatus for mounting micro-balls on a work for a substrate, chip, or so forth, wherein an adsorption jig in a sheet-like shape is provided with a plurality of adsorption holes disposed so as to correspond to positions of electrode pads formed on a work, and a group of micro-balls in number corresponding to at least one feed thereof for the work are caused to be adsorbed to the respective adsorption holes, so that the micro-balls adsorbed to the adsorption jig are bonded to the electrode pads on the work.

As shown in FIG. 14, an adsorption unit of this type is provided with an adsorption head 1 which can be moved up and down by a hoisting and lowering mechanism (not shown), and the adsorption head 1 has an adsorption jig 2 in a plate-like shape, provided with a plurality of adsorption holes 2a for vacuum-adsorbing micro-balls which are fluidized and floated.

Further, as shown in FIG. 15, when sucking operation is performed by use of a suction unit (not shown) with the adsorption head 1 already lowered by the hoisting and lowering mechanism, and brought in close proximity to the micro-balls B contained in a stock dish 3 made of metal, installed in the lower part of the adsorption unit, the micro-balls B are vacuum-adsorbed to the adsorption holes 2a of the adsorption jig 2.

With the adsorption unit of this type, the adsorption holes 2a formed in the adsorption jig 2 have a very small diameter, and consequently, air has little fluidity away from the adsorption holes 2a. Accordingly, the stock dish 3 containing the micro-balls B is caused to undergo vibration by use of a vibration generator 4 such as a parts feeder or the like, and the the micro-balls B are sent flying as far as the vicinity of the adsorption holes 2a, thereby enhancing adsorbability thereof. That is, the stock dish 3 provided with the vibration generator 4 serves as ball feeding means for carrying the micro-balls B to the adsorption holes 2a.

Now, the adsorption unit described above is to cause the micro-balls B to be floated through vibration of the stock dish 3 with the use of the vibration generator 4, however, this is not a case where the micro-balls B are sent flying towards all of the adsorption holes 2a at a uniform density. Accordingly, there is a risk that an excessive number of the micro-balls B are adsorbed to some of the adsorption holes 2a on one hand, and none of the micro-balls B is adsorbed to some of the adsorption holes 2a on the other hand.

Furthermore, when the adsorption head 1 sucks in the micro-balls B out of the stock dish 3, and holds the same, one each of the micro-balls B is desirably held by the respective adsorption holes 2a. However, it has been observed that an excess of the micro-balls sticks between the adjacent micro-balls B normally held by the adsorption jig 2, or the excess of the micro-balls sticks to the micro-balls B themselves normally held by the adsorption jig 2, in a condition resembling hanging icicles.

For that reason, it has been in practice that one each of the micro-balls B is fed into the respective adsorption holes 2a of the adsorption jig 2 by use of a filter for removal of the excess of the micro-balls B, provided with holes, each large enough to allow only one of the micro-balls B to pass therethrough, formed at positions corresponding to the respective adsorption holes 2a of the adsorption jig 2. However, this will require a complex mechanism for aligning the adsorption jig 2 with the filter for removal of the excess of the micro-balls B.

Taking into consideration the problem described above, the inventor has developed a system wherein with the use of a ball feeding unit having an arraying jig provided with array holes to which the micro-balls B are adsorbable, formed at positions corresponding to the respective adsorption holes 2a of the adsorption jig 2, the micro-balls B are lined up opposite to the array holes formed in the arraying jig of the ball feeding unit to enable the micro-balls B in the arraying jig to be delivered to the adsorption jig 2. With the system, the micro-balls B can be adsorbed efficiently one by one to the respective adsorption holes 2a of the adsorption jig 2.

Even with this system, however, there have been cases where the excess of the micro-balls B is stuck to the array holes of the arraying jig, so that the micro-balls B are excessively fed to the adsorption holes 2a of the adsorption jig 2, and adsorbed thereto.

SUMMARY OF THE INVENTION

In view of the circumstance described above, the present invention has been developed, and an object of the invention is to provide a method of lining up micro-balls in a micro-ball mounting apparatus of a semiconductor device manufacturing system, whereby micro-balls to be formed into bumps can be distributed and lined up on an arraying jig, having a plurality of array holes, without an excess of the micro-balls sticking thereto, and without causing an increase in cost.

To this end, in accordance with a first aspect of the invention, there is provided a method of lining up micro-balls whereby the micro-balls to be formed into bumps are lined up on an arraying jig, the micro-balls lined up are adsorbed to an adsorption jig, and prior to mounting the micro-balls adsorbed on a work, the micro-balls are adsorbed to the adsorption jig of an adsorption head; the method comprising: a micro-ball adsorption step for causing the micro-balls to be adsorbed to a plurality of array holes by supplying the micro-balls onto the arraying jig having the plurality of the array holes formed therein, and by sucking in air through the array holes, a micro-ball distribution step for distributing the micro-balls placed on the arraying jig into the respective array holes, and an excessive micro-ball removal step for removing an excess of the micro-balls, sticking to the arraying jig, wherein, in the excessive micro-ball removal step, a cylindrical body in the shape of a cylinder is disposed on the arraying jig, a standing wave having nodes thereof, formed concentrically, is generated inside the cylindrical body by subjecting the cylindrical body to ultrasonic vibration, and the excess of the micro-balls, sticking to the top of the arraying jig, is concentrated at the nodes of the standing wave before removal by moving the cylindrical body horizontally over the arraying jig.

Thus, since the cylindrical body in the shape of a cylinder is disposed on the arraying jig after the micro-balls are supplied to and adsorbed to the top of the arraying jig, the standing wave having nodes thereof, formed concentrically, is generated inside the cylindrical body by subjecting the cylindrical body to ultrasonic vibration, and the excess of the micro-balls, sticking to the top of the arraying jig, is concentrated at the nodes of the standing wave before removal by moving the cylindrical body horizontally over the arraying jig while maintaining the above-mentioned condition of the cylindrical body, the micro-balls can be lined up properly by ensuring removal of the excess of the micro-balls, sticking to the arraying jig.

As a result, the micro-balls lined up on the arraying jig can be adsorbed to the adsorption jig, and can be mounted on a work with certainty.

Further, in the first aspect of the invention, the cylindrical body may be formed in the shape of a bottomed cylinder, having an opening at an end thereof, facing the arraying jig, and in the micro-ball adsorption step, the cylindrical body may be brought in close proximity to the top of the arraying jig so as to cover the array holes after the micro-balls are supplied onto the arraying jig, and in that condition, the micro-balls may be adsorbed to the array holes by sucking in air through the array holes.

Thus, the cylindrical body in the shape of the bottomed cylinder, having the opening at an end thereof, is brought in close proximity to the top of the arraying jig so as to cover the array holes after the micro-balls are supplied onto the arraying jig, and by sucking in air through the array holes so as to adsorb the micro-balls thereto while keeping up the above-mentioned condition, a degree of vacuum in a space between the arraying jig and the cylindrical body can be raised, and an air flow from a gap between the cylindrical body and the arraying jig to the array holes of the arraying jig can be rendered stronger, thereby boosting suction of the micro-balls through the array holes to a large extent.

With these features described, in the micro-ball distribution step, the standing wave having the nodes thereof concentrically formed may be generated inside the cylindrical body by subjecting the same to ultrasonic vibration, the micro-balls on the arraying jig may be caused to be concentrated at the nodes of the standing wave, and while keeping up the above-mentioned condition, the cylindrical body may be moved horizontally over the arraying jig.

That is, the standing wave having the nodes thereof, concentrically formed, is generated inside the cylindrical body by subjecting the same to ultrasonic vibration, the micro-balls on the arraying jig is caused to be concentrated at the nodes of the standing wave, and while keeping up the above-mentioned condition, the cylindrical body is moved horizontally over the arraying jig. Hence, the micro-balls can be evenly distributed into the respective array holes of the arraying jig, and can be lined up properly.

BRIEF DESCRIPTION OF THE DRAWINGS

FIG. 14 is a sectional view illustrating an operation of supplying micro-balls to an adsorption head according to a conventional micro-ball mounting apparatus.

DESCRIPTION OF THE PREFERRED EMBODIMENTS

Embodiments of the invention will be described hereinafter with reference to the accompanying drawings.

Figure 1:
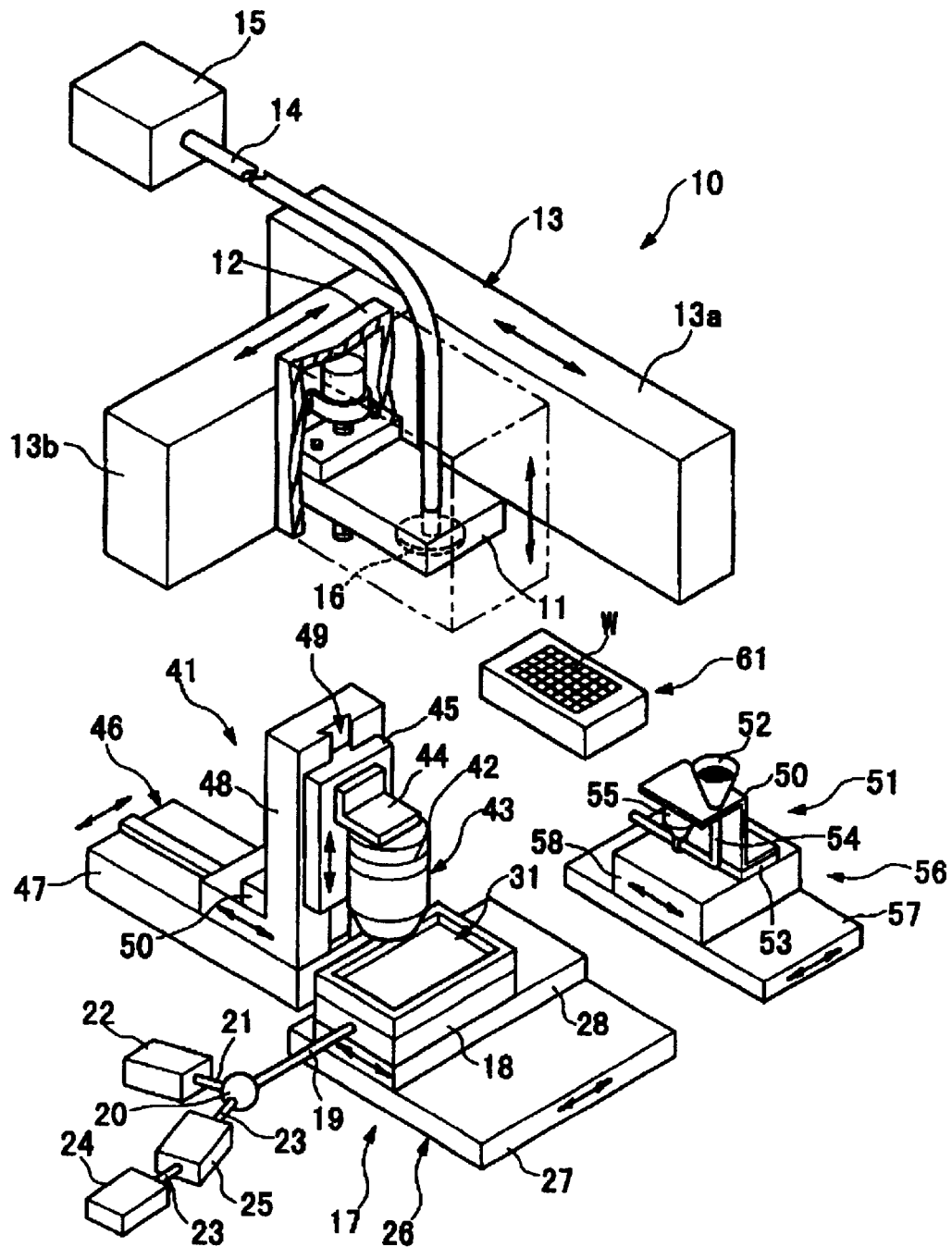
FIG. 1 is a perspective view of a micro-ball mounting apparatus for illustrating an embodiment of a method of lining up micro-balls according to the invention.

FIG. 1 is an assembly view showing a micro-ball mounting apparatus wherein an embodiment of a method of lining up micro-balls according to the invention is carried out. In FIG. 1, reference numeral 10 designates a ball adsorption or ball transfer unit, 17 a ball supply unit, 41 a ball distribution unit, 51 a ball feeding unit, and 61 a work holder.

As shown in FIG. 1, an adsorption or transfer head 11, one of constituents of the ball adsorption unit 10, is supported by a traveling mechanism 13 through the intermediary of a hoisting and lowering mechanism 12. The traveling mechanism 13 has a support section 13a fixedly attached to a base, and an arm 13b supported by the support section 13a so as to be movable in one direction relative thereto, and the adsorption head 11 equipped with a hoisting and lowering mechanism 12 is supported by the arm 13b so as to be movable in a direction perpendicular to the traveling direction of the arm 13b.

That is, the adsorption head 11 is enabled by the traveling mechanism 13 to be movable in two directions crossing each other at right angles.

A suction unit (sucking means) 15 is linked with the adsorption head 11 via a tube 14 so as to be able to suck in air through adsorption or suction holes 16a, as described later, formed in an adsorption or transfer jig 16 for the adsorption or transfer head 11.

The ball supply unit 17 is installed on the base, and a changeover valve 20 is linked with a case 18, one of constituents of the ball supply unit 17, via a tube 19. A compressed air source 22 is linked with the changeover valve 20 via a tube 21.

Further, a suction unit 24 is linked with the changeover valve 20 via a tube 23, and a regulator 25 for controlling a sucking force of the suction unit 24 is installed between the suction unit 24 and the changeover valve 20.

The compressed air source 22 or the suction unit 24 is alternatively linked with the tube 19 leading to the case 18 by causing changeover of a flow path with the use of the changeover valve 20.

The case 18 is mounted on a traveling mechanism 26 installed on the base. The traveling mechanism 26 comprises an installation frame 27 and a support frame 28 which are movable in respective directions crossing each other at right angles.

Figure 2:
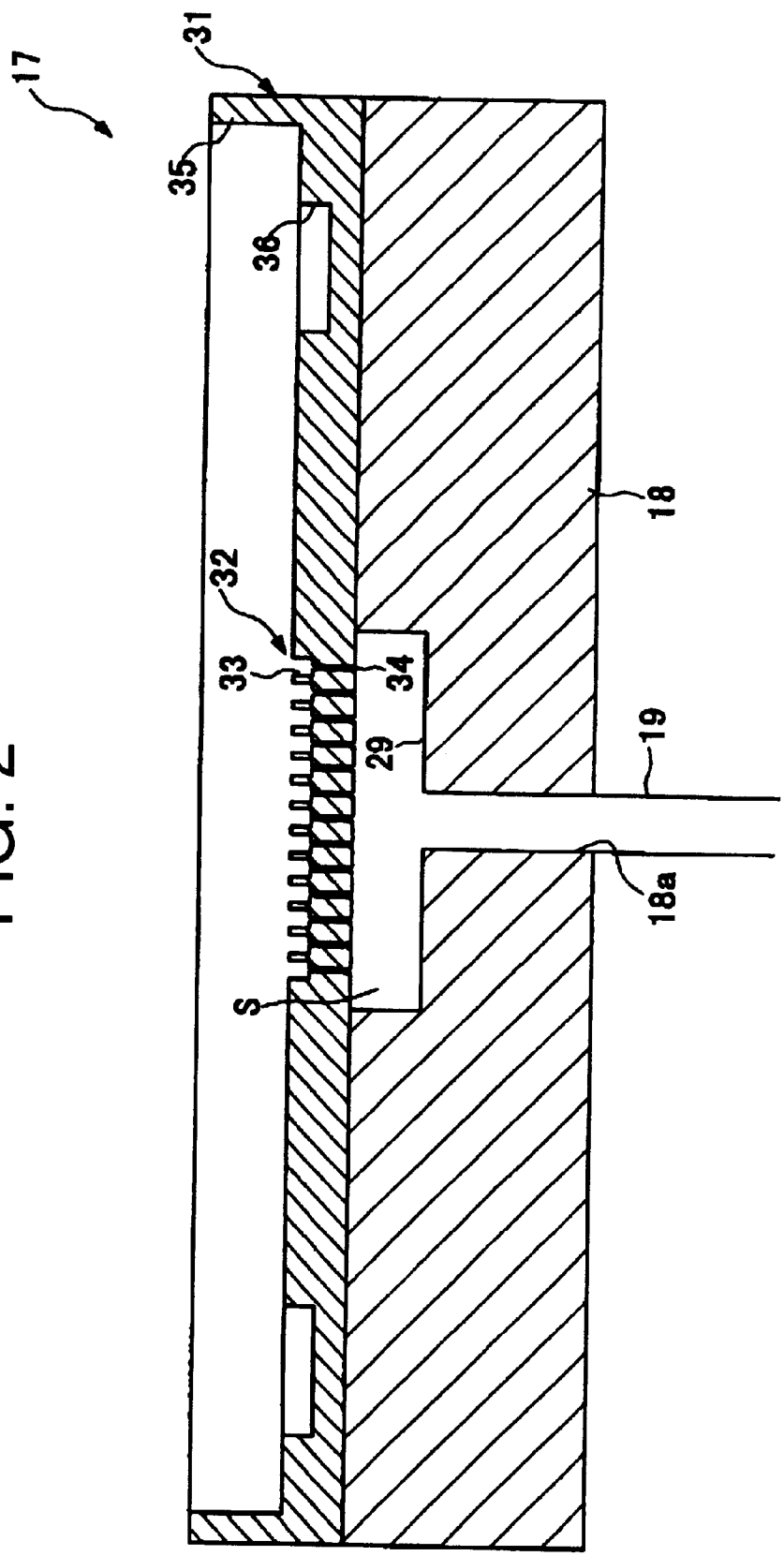
FIG. 2 is a sectional view of a ball supply unit of the micro-ball mounting apparatus for illustrating the embodiment of the method of lining up micro-balls according to the invention.

Further, as shown in FIG. 2, the case 18 is provided with a recessed part 29, formed on an upper surface thereof and leading to a port 18a with which the tube 19 is connected, and is also provided with an arraying jig 31 on a side of the upper surface thereof.

The arraying jig 31 is provided with a plurality of array holes 32 formed in such a way as to penetrate therethrough and to be linked with a space S surrounded by the arraying jig 31 and the recessed part 29.

A part of the respective array holes 32 formed in the arraying jig 31, on the side of the upper surface thereof, serves as a ball holding hole part 33 formed so as to have a diameter slightly larger than that of respective micro-balls B, and a part of the respective array holes 32, on a side of the under surface of the arraying jig 31, serves as a ventilation hole part 34 formed so as to have a diameter slightly smaller than that of respective micro-balls B. The ball holding hole part 33 is set to have a depth not less than the diameter of the respective micro-balls B, but less than twice the diameter thereof. That is, the ball holding hole part 33 is set to have a size large enough to enable the same to hold just one of the micro-balls B.

Furthermore, the arraying jig 31 is provided with a wall 35 formed so as to stand upward on the periphery thereof, so that the wall 35 can prevent the micro-balls B on the arraying jig 31 from falling off. The arraying jig 31 is also provided with a groove 36 formed so as to surround the array holes 32.

When the compressed air source 22 is linked with the case 18 by the agency of the changeover valve 20, air is jetted out through the array holes 32 formed in the arraying jig 31, and when the suction unit 24 is linked with the case 18 by the agency of the changeover valve 20, air is sucked in through the array holes 32 of the arraying jig 31.

A ball distribution unit 41 is installed by the side of the ball supply unit 17 in close proximity thereto on the base. The ball distribution unit 41 has a cylindrical body 43 equipped with an ultrasonic vibrator for generating ultrasonic vibration.

The cylindrical body 43 is supported by a elevator 45 through the intermediary of a bracket 44, and the elevator 45 is supported by a support frame 48 of a traveling mechanism 46 as described later in such a way as to be able to be hoisted or lowered by a hoisting and lowering mechanism 49.

The traveling mechanism 46 comprises an installation frame 47 and a support frame 48, which are movable in respective directions crossing each other at right angles, and the traveling mechanism 46 is made up such that the cylindrical body 43 supported by the elevator 45 can travel in two directions on a plane, and in parallel with the plane.

By actuating the hoisting and lowering mechanism 49 with the cylindrical body 43 in a condition wherein it has been caused to travel toward above the arraying jig 31 by the traveling mechanism 46, the cylindrical body 43 is moved to close proximity to the arraying jig 31 or to move away therefrom.

The support frame 48 is equipped with an ultrasonic vibration generator 50, and the ultrasonic vibration generator 50 causes the ultrasonic vibrator 42 of the cylindrical body 43 to undergo ultrasonic vibration.

Figure 3:
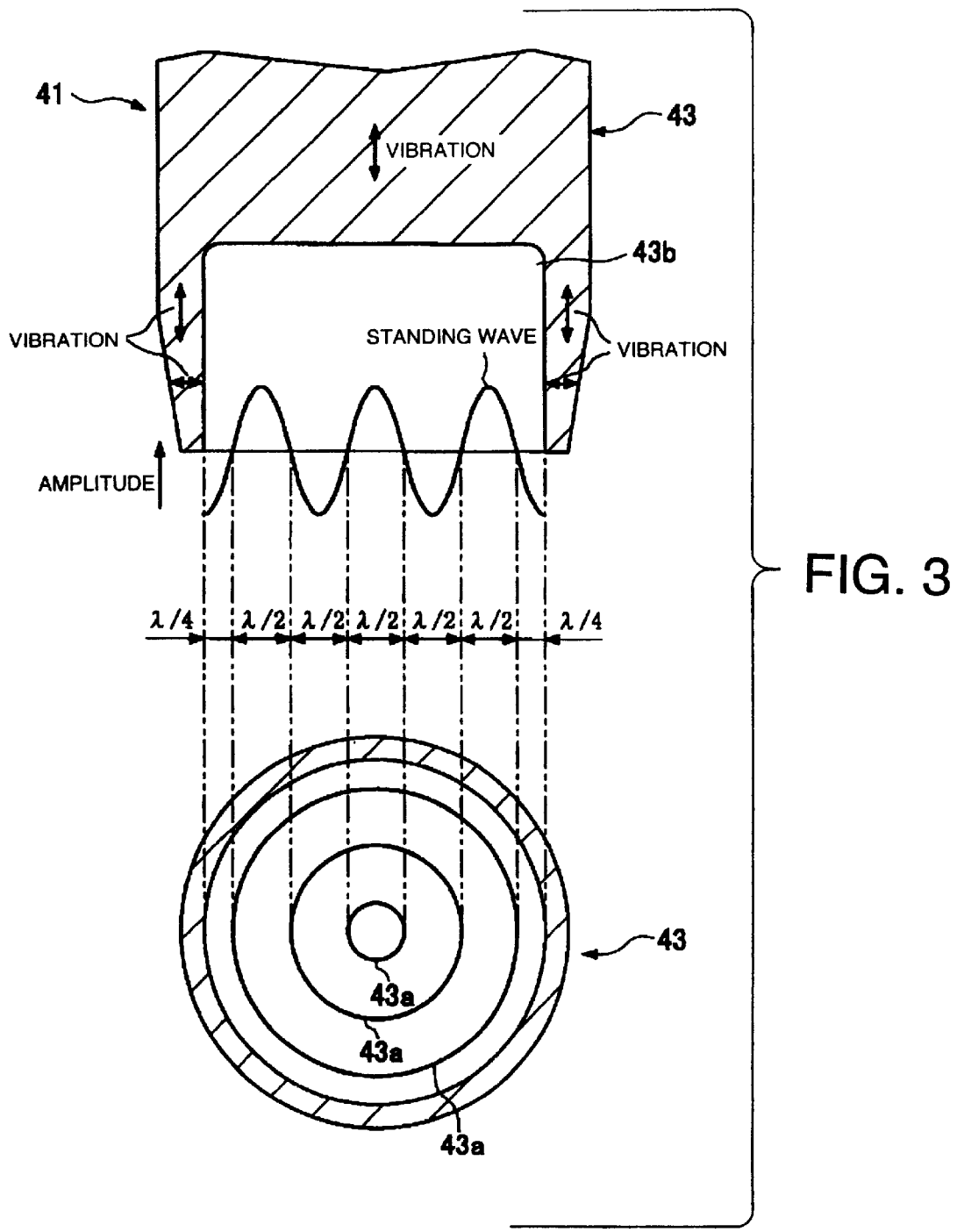
FIG. 3 is a schematic illustration of a standing wave generated in a ball distribution unit of the micro-ball mounting apparatus for illustrating the embodiment of the method of lining up micro-balls according to the invention.

As shown in FIG. 3, the cylindrical body 43 formed in the shape of a bottomed cylinder is provided with the ultrasonic vibrator 42 on the bottom side thereof, and is disposed such that an end thereof, having an opening 43b, pointing downward, that is, towards the arraying jig 31. Further, a tip part of the cylindrical body 43 is formed in a tapered shape with a diameter thereof gradually decreasing towards an extremity thereof, thus rendering the wall thickness of the tip part thinner towards the extremity.

Figure 4:
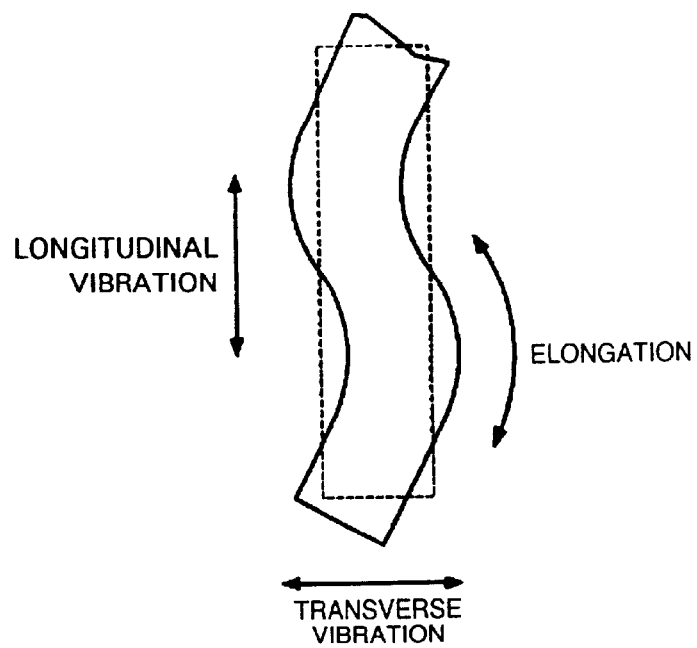
FIG. 4 is a sectional view of a part of a cylindrical body installed in the ball distribution unit of the micro-ball mounting apparatus for illustrating the embodiment of the method of lining up micro-balls according to the invention.

Now, referring to FIG. 3, a condition of ultrasonic vibration occurring inside the cylindrical body 43 is described hereinafter. FIG. 3 shows amplitudes of ultrasonic waves in a horizontal sectional view as well as a vertical sectional view of the cylindrical body 43. When the ultrasonic vibrator 42 is caused to generate ultrasonic vibration, the cylindrical body 43 is subjected to longitudinal vibration and transverse vibration as shown in FIG. 4 by the ultrasonic waves, thereby causing the cylindrical body 43 to elongate or contract in the direction of the radius thereof.

If the inside diameter of the cylindrical body 43 is set at an integral multiple of a wavelength $\lambda$ as determined by vibration frequency and the velocity of sound, this will cause a standing wave to be generated inside the cylindrical body 43, and nodes 43a of the standing wave to appear concentric. The outermost concentric circle is located at a distance of 1/4 wavelength ($\lambda$) from the inner surface of the cylindrical body 43, and respective concentric circles appear at an interval of 1/2 $\lambda$ therefrom, so that the innermost concentric circle has a diameter of 1/2 $\lambda$.

When the standing wave is caused to be generated inside the cylindrical body 43 as described above, the micro-balls B come to be concentrated at positions of the respective nodes 43a of the standing wave that has been generated. That is, as a result of ultrasonic vibration, the micro-balls B come to be concentrated compactly and concentrically inside the cylindrical body 43.

The ball feeding unit 51 comprises a ball bin 52, a weight detection sensor 53 installed underneath a bracket 50 for supporting the ball bin 52, and used for detecting a weight of the ball bin 52, a feeding tube 54 linked with the lower end of the ball bin 52, and an ultrasonic motor 55 for causing the feeding tube 54 to undergo elliptical vibration by subjecting the feeding tube 54 to ultrasonic vibration, thereby sending out the micro-balls B through the tip of the feeding tube 54. The ball feeding unit 51 having such a construction as described above is supported on the base by a traveling mechanism 56.

The traveling mechanism 56 comprises an installation frame 57 fixedly attached to the base and a support frame 58 supported by the installation frame 57 so as to be movable in a direction perpendicular relative to the installation frame 57, and the support frame 58 is provided with the ball feeding unit 51. That is, the traveling mechanism 56 enables the ball feeding unit 51 to travel in two directions crossing each other at right angles, and by causing the traveling mechanism 56 to move the ball feeding unit 51, the tip of the feeding tube 54 of the ball feeding unit 51 can be disposed at a position above the arraying jig 31.

That is, the micro-balls B can be fed onto the arraying jig 31 by driving the ultrasonic motor 55, and subjecting the feeding tube 54 to elliptical vibration, thereby sending out the micro-balls B through the tip of the feeding tube 54, with the tip of the feeding tube 54 of the ball feeding unit 51 kept in a condition wherein it is disposed above the arraying jig 31.

The work holder 61 is for holding a work W such as a substrate or the like on an upper surface thereof such that the micro-balls B can be mounted on the work W held on the upper surface of the work holder 61.

Now, with the micro-ball mounting apparatus having a constitution as described above, a control system is described hereinafter.

Figure 5:
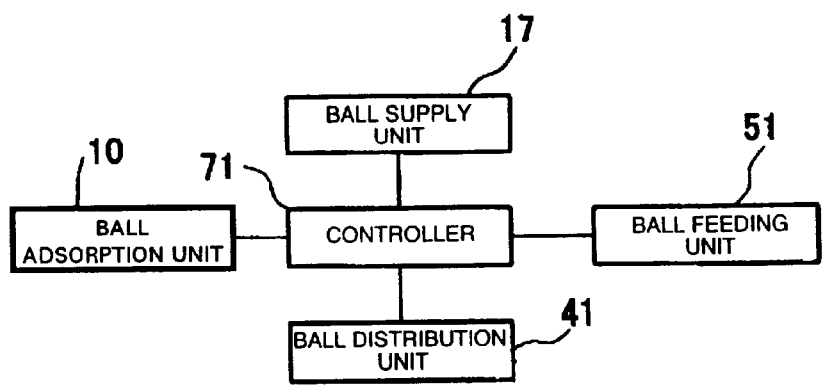
FIG. 5 is a functional block diagram of the micro-ball mounting apparatus for illustrating the embodiment of the method of lining up micro-balls according to the invention.

In FIG. 5, reference numeral 71 designates a controller for controlling driving of the micro-ball mounting apparatus. The ball adsorption unit 10, the ball supply unit 17, the ball distribution unit 41, and the ball feeding unit 51 are connected to the controller 71, such that driving of the respective units can be controlled by the controller 71.

Figure 6:
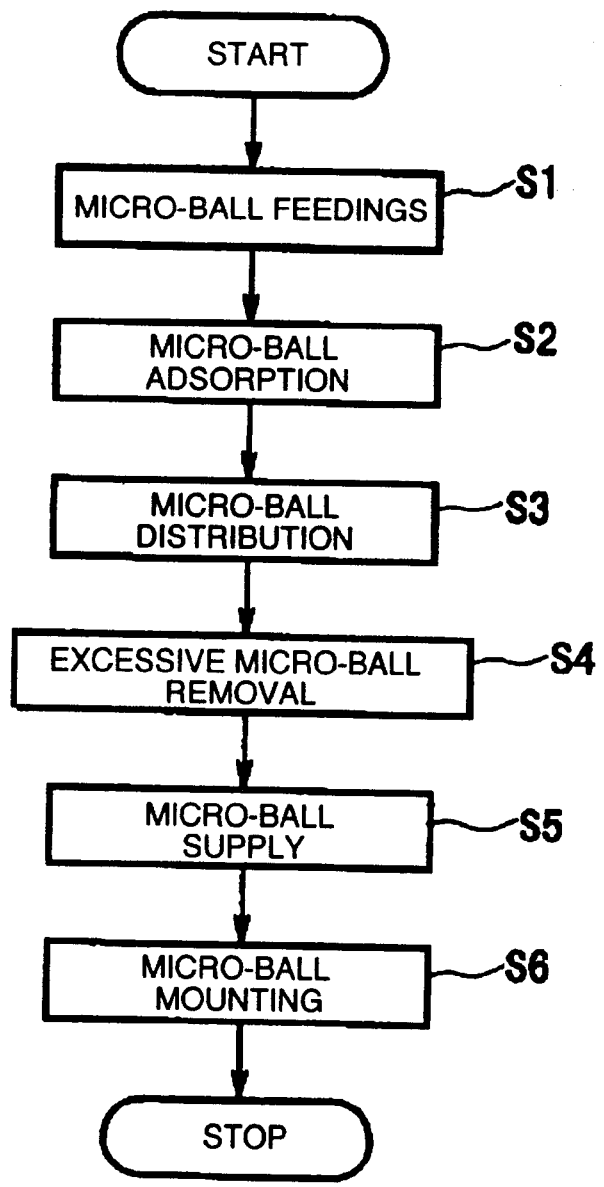
FIG. 6 is a flow chart for illustrating the embodiment of the method of lining up micro-balls according to the invention.

Next, operation of the micro-ball mounting apparatus used in carrying out the embodiment of the method of lining up micro-balls according to the invention is described hereinafter with reference to a flow chart shown in FIG. 6.

Step S1 (Step of Feeding Micro-balls)

Figure 7:
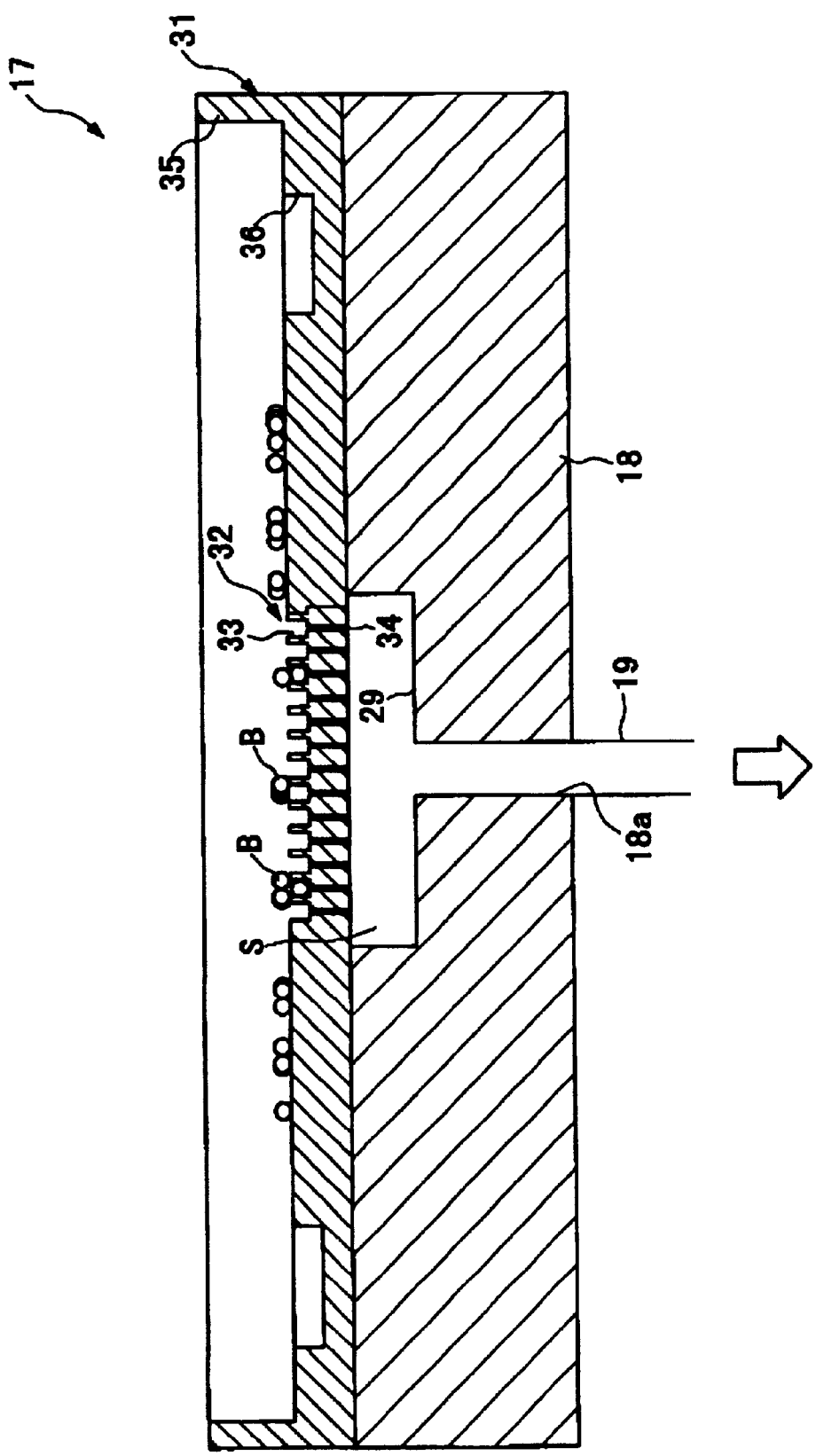
FIG. 7 is another sectional view of the ball supply unit of the micro-ball mounting apparatus for illustrating the embodiment of the method of lining up micro-balls according to the invention.

In a condition wherein the tip of the feeding tube 54 of the ball feeding unit 51 is disposed at a position above the arraying jig 31 of the ball supply unit 17, a part of the feeding tube 54, in close proximity to the tip thereof, is subjected to elliptical vibration, thereby supplying micro-balls B by feeding the same to the top part of the arraying jig 31 through the feeding tube 54 as shown in FIG. 7.

In this connection, when the micro-balls B are fed by the ball feeding unit 51, the controller 71 finds variation in the weight of the ball bin 52 as necessary on the basis of signals from the weight detection sensor 53 of the ball feeding unit 51, and on the basis of such variation, finds a feed amount of the micro-balls B delivered from the feeding tube 54. When the feed amount gets up substantially to an amount necessary for just one mounting operation, the controller 71 stops driving the ultrasonic motor 55, thus stopping feeding of the micro-balls B from the feeding tube 54.

Step S2 (Step of Adsorbing the Micro-balls B)

Subsequently, the cylindrical body 43 of the ball distribution unit 41 is moved to a position above the arraying jig 31 of the ball supply unit 17 by the traveling mechanism 46, and the cylindrical body 43 in this condition is lowered by the hoisting and lowering mechanism 49 before disposed in close proximity to the top of the arraying jig 31.

Meanwhile, with the ball supply unit 17, the suction unit 24 is linked with the case 18 by the agency of the changeover valve 20, and air is sucked in through the array holes 32 of the arraying jig 31 by the suction unit 24.

Further, the arraying jig 31 of the ball supply unit 17, in this condition, is reciprocatively moved in the horizontal direction by the traveling mechanism 26.

Figure 8:
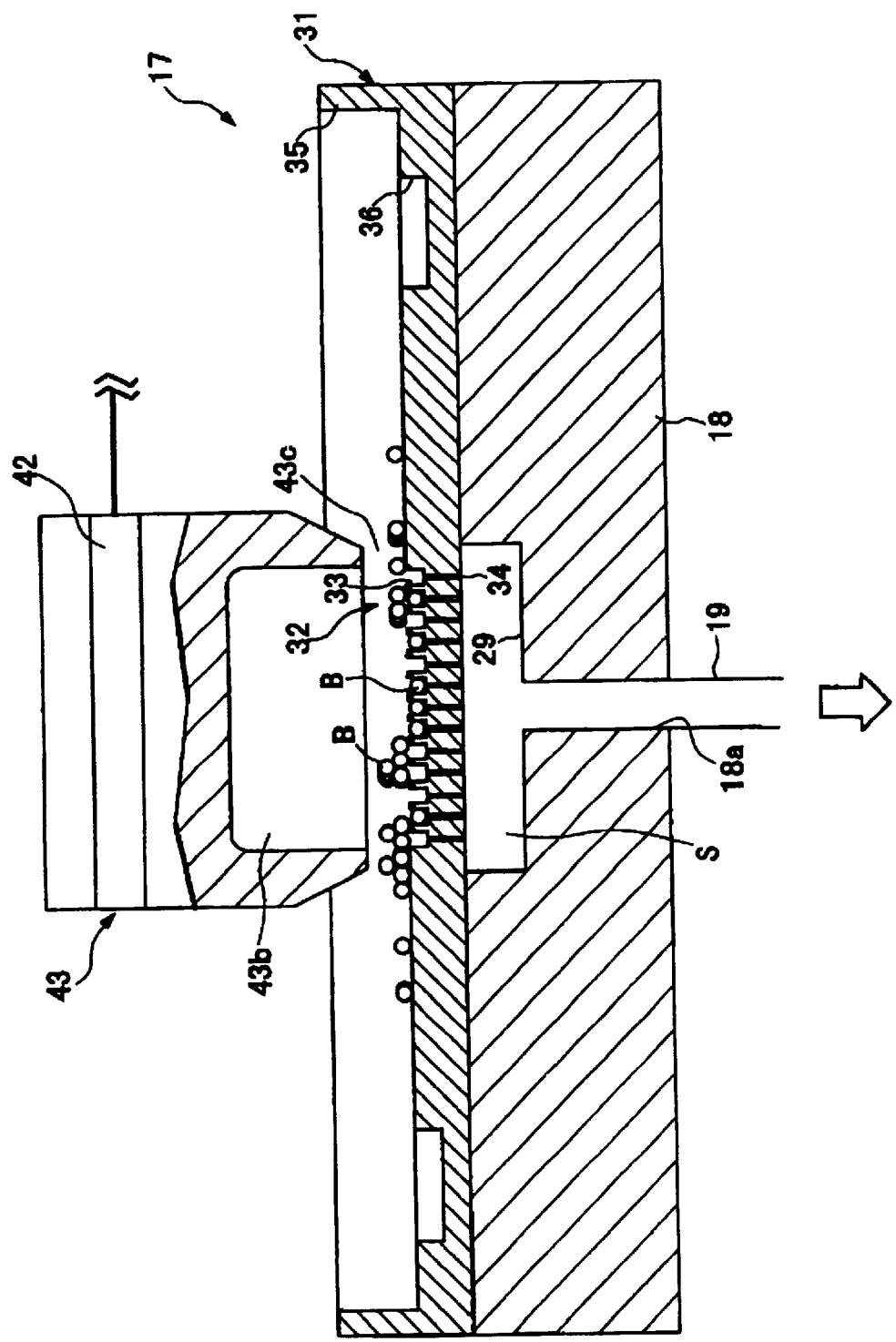
FIG. 8 is a sectional view of the ball distribution unit and the ball supply unit of the micro-ball mounting apparatus for illustrating the embodiment of the method of lining up micro-balls according to the invention.

As a result, as shown in FIG. 8, the micro-balls B on the arraying jig 31 make ingress by inertia into the ball holding hole part 33 of the respective array holes 32 through which the micro-balls B are being sucked by the suction unit A 24.

Further, since the cylindrical body 43 is in the shape of a bottomed cylinder as described hereinbefore, a degree of vacuum in a space 43b between the cylindrical body 43 and the arraying jig 31 is enhanced, and a air flow from a gap 43c between the cylindrical body 43 and the arraying jig 31 to the array holes 32 of the arraying jig 31 becomes stronger, thereby boosting suction of the micro-balls B through the array holes 32.

However, with vacuum suction as described above alone, a density at which the micro-balls B are supplied to the array holes 32 is uneven, and consequently, there are some of the array holes 32 into which none of the micro-balls B is sucked.

At this point in time, the number of the array holes 32 into which each of the micro-balls B has been fed will have increased over that at a time when the micro-balls B were supplied onto the arraying jig 31, and accordingly, some of the array holes 32 into which none of the micro-balls B has been sucked are in a condition wherein a sucking or vacuum force acting therethrough has increased.

Step S3 (Step of Distributing the Micro-balls)

Figure 9:
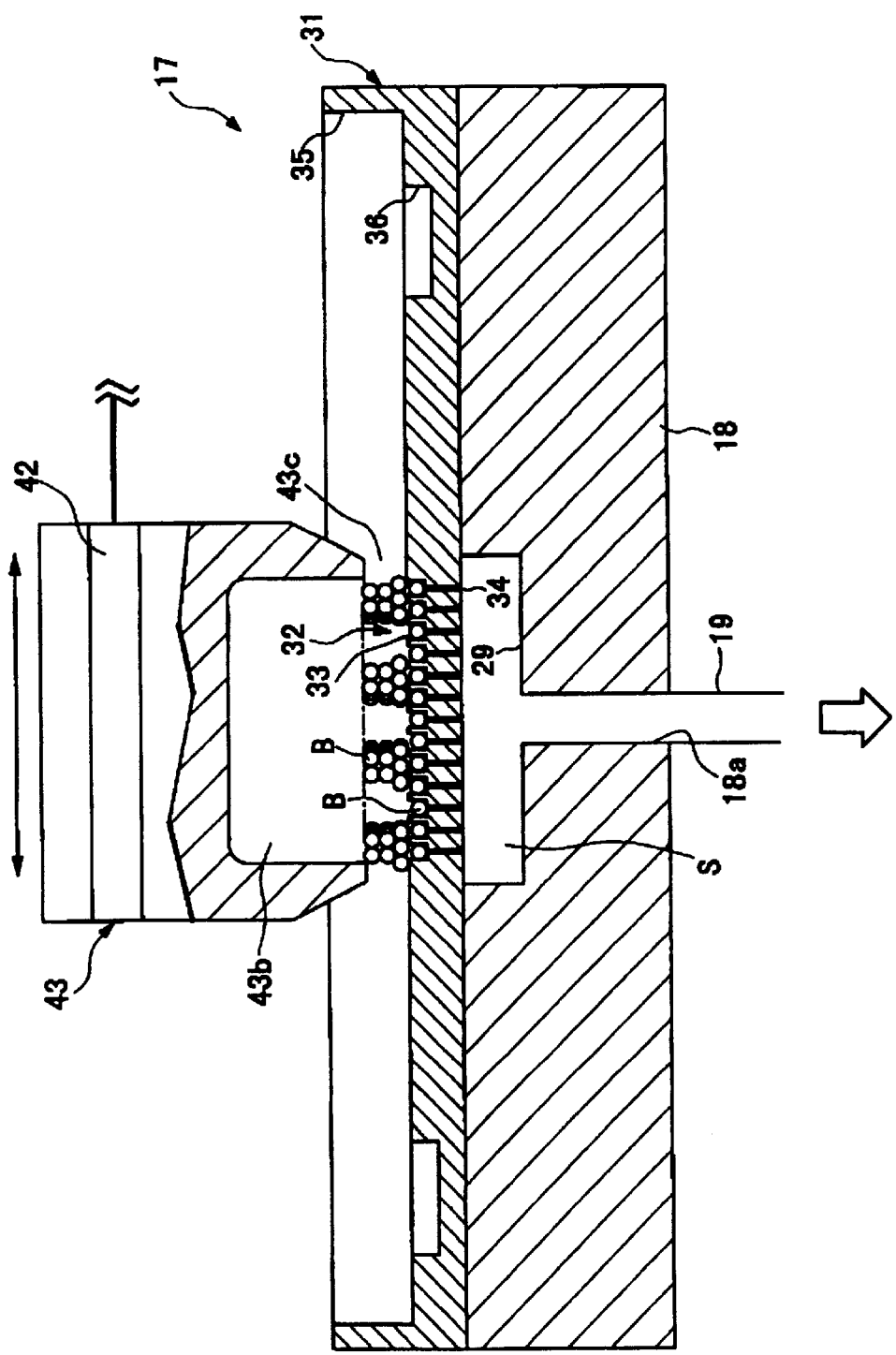
FIG. 9 is another sectional view of the ball distribution unit and the ball supply unit of the micro-ball mounting apparatus for illustrating the embodiment of the method of lining up micro-balls according to the invention.

Subsequently, the ultrasonic vibrator 42 installed in the cylindrical body 43 is caused to undergo ultrasonic vibration by the ultrasonic vibration generator 50 of the ball distribution unit 41, whereupon, as shown in FIG. 9, a standing wave is generated inside the cylindrical body 43, and the micro-balls B are concentrated compactly and concentrically at points of the nodes 43a of the standing wave.

Figure 10:
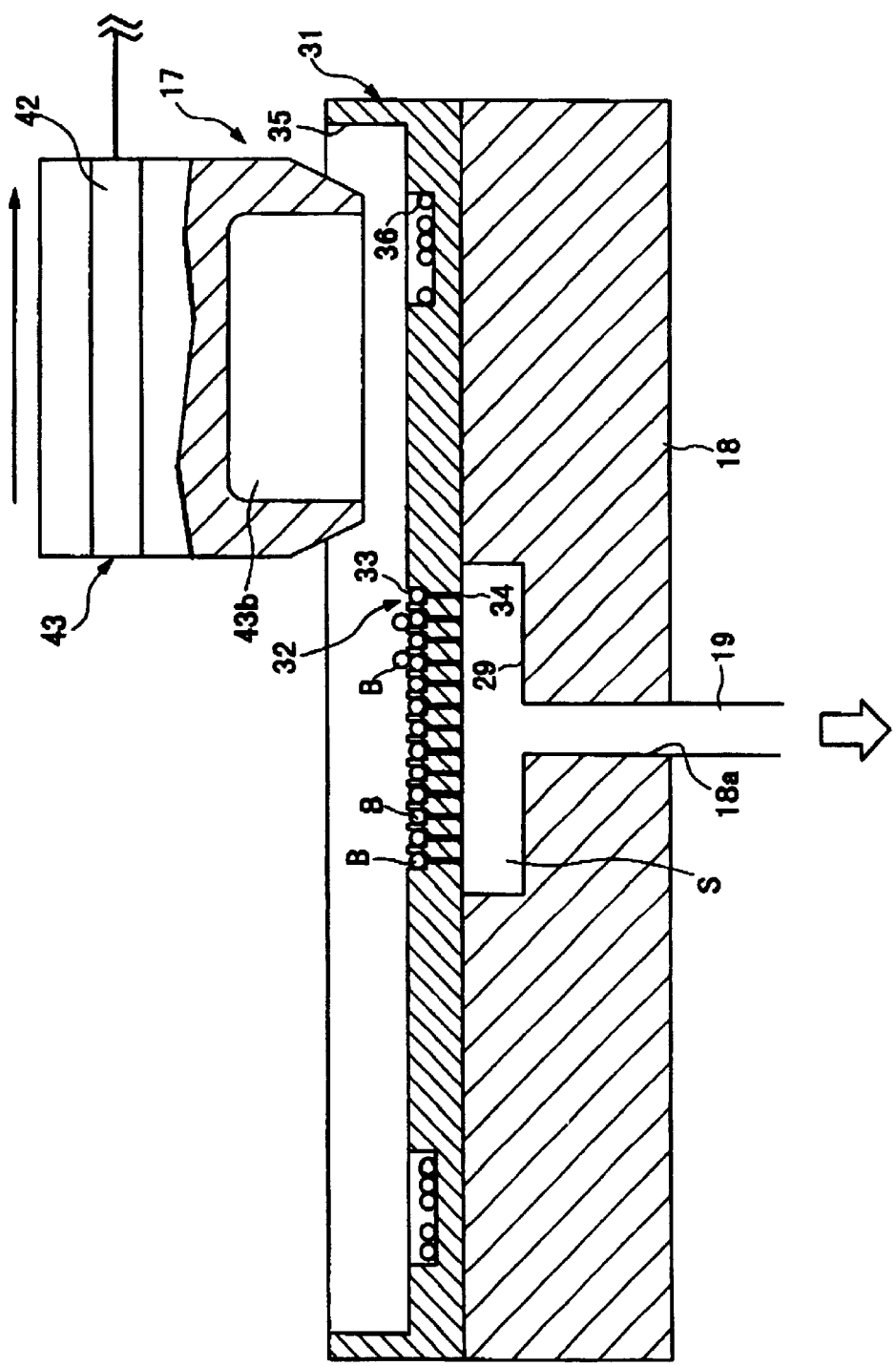
FIG. 10 is still another sectional view of the ball distribution unit and the ball supply unit of the micro-ball mounting apparatus for illustrating the embodiment of the method of lining up micro-balls according to the invention.

The cylindrical body 43 in this condition is moved by the traveling mechanism 46 of the ball distribution unit 41, and the micro-balls B concentrated inside the cylindrical body 43 as described above are moved over the array holes 32 of the arraying jig 31, so that the micro-balls B are adsorbed to and held by the ball holding hole parts 33 of the respective array holes 32 through which air is being sucked. Thereafter, as shown in FIG. 10, the cylindrical body 43 is moved to a position away from the array holes 32.

Further, an excess of the micro-balls B is dropped into the groove 36 formed on the arraying jig 31.

FIG. 9 shows a case where there are two of the nodes 43a of the standing wave, appearing in the form of concentric circles.

Figure 11:
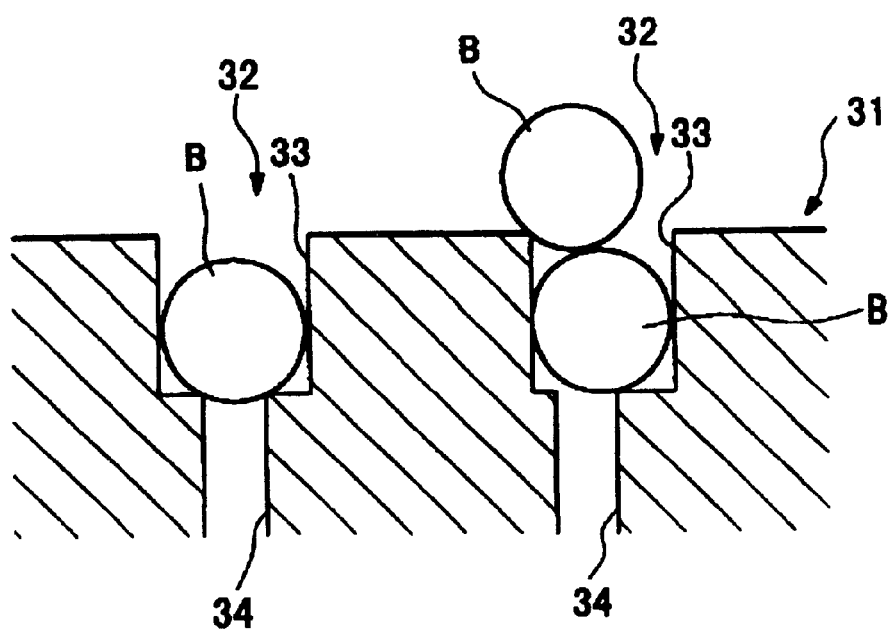
FIG. 11 is a sectional view of a part of an arraying jig used in the micro-ball mounting apparatus for illustrating the embodiment of the method of lining up micro-balls according to the invention.

As described in the foregoing, each of the micro-balls B is held with certainty in the ball holding hole part 33 of the respective array holes 32 of the arraying jig 31 through distribution of the micro-balls B by the ball distribution unit 41. As shown in FIG. 11, however, in case that the ball holding hole part 33 and the ventilation hole part 34, making up the respective array hole 32, are not exactly aligned with each other, the ventilation hole part 34 is not clogged up with the micro-ball B even when the micro-ball B is fed into the ball holding hole part 33. Consequently, suction of air through the array hole 32 does not come to a stop, thereby sucking in an excess of the micro-balls B by crevice suction through the array hole 32.

For this reason, the excess of the micro-balls B is removed by taking a subsequent step as follows.

Step S4 (Step of Removing the Excess of the Micro-balls)

In a condition wherein there exists the excess of the micro-balls B after the micro-balls B are fed into the array holes 32 of the arraying jig 31, a sucking or vacuum force of the suction unit 24 is reduced by the regulator 25, whereupon an adsorptive force for the excess of the micro-balls B adsorbed to the respective array holes 32 by crevice suction is weakened.

In this condition, the ultrasonic vibrator 42 installed in the cylindrical body 43 of the ball distribution unit 41 is subjected to vibration, and simultaneously, the cylindrical body 43 is moved horizontally over the arraying jig 31.

Figure 12:
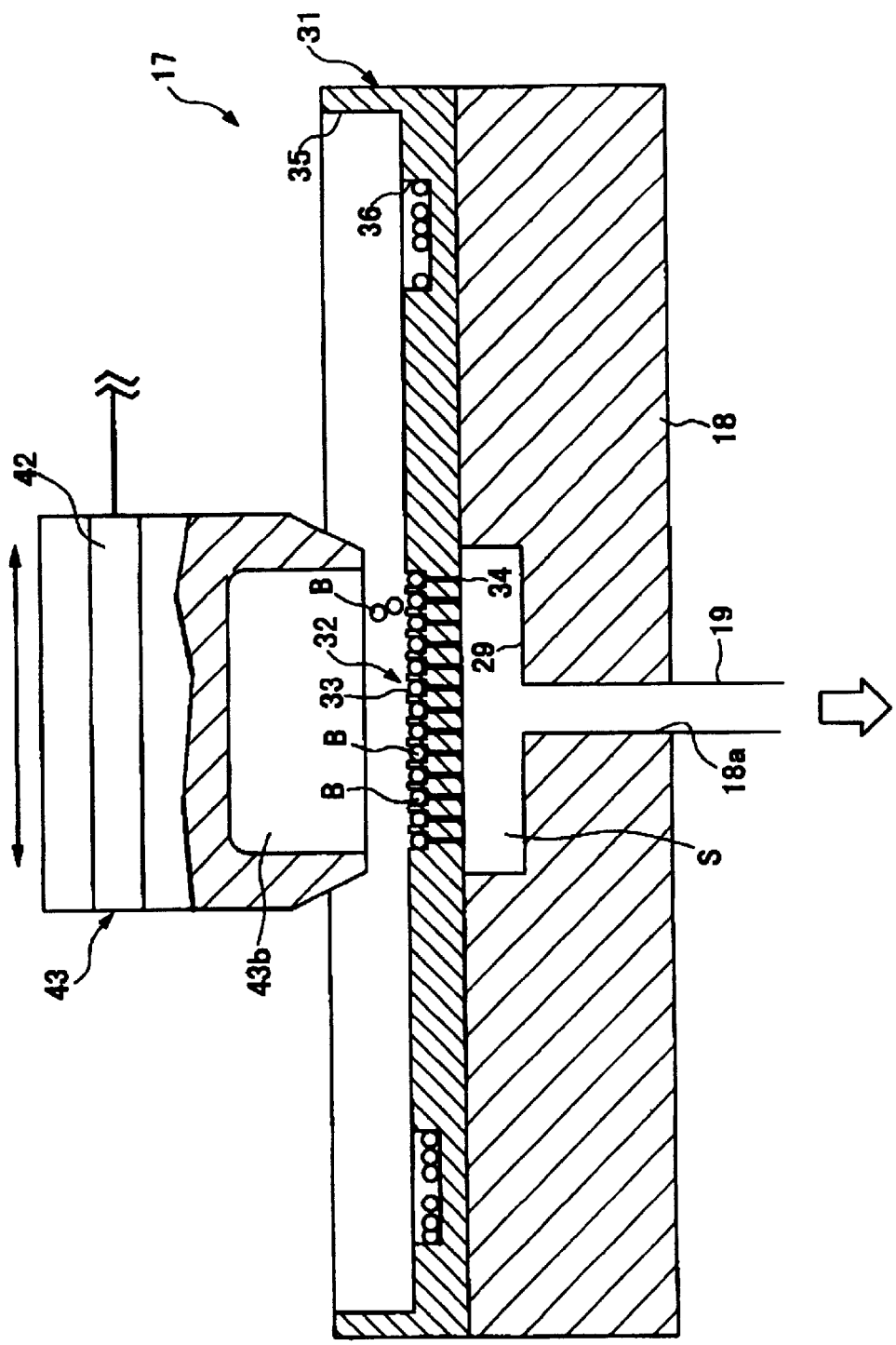
FIG. 12 is yet another sectional view of the ball distribution unit and the ball supply unit of the micro-ball mounting apparatus for illustrating the embodiment of the method of lining up micro-balls according to the invention.
Figure 13:
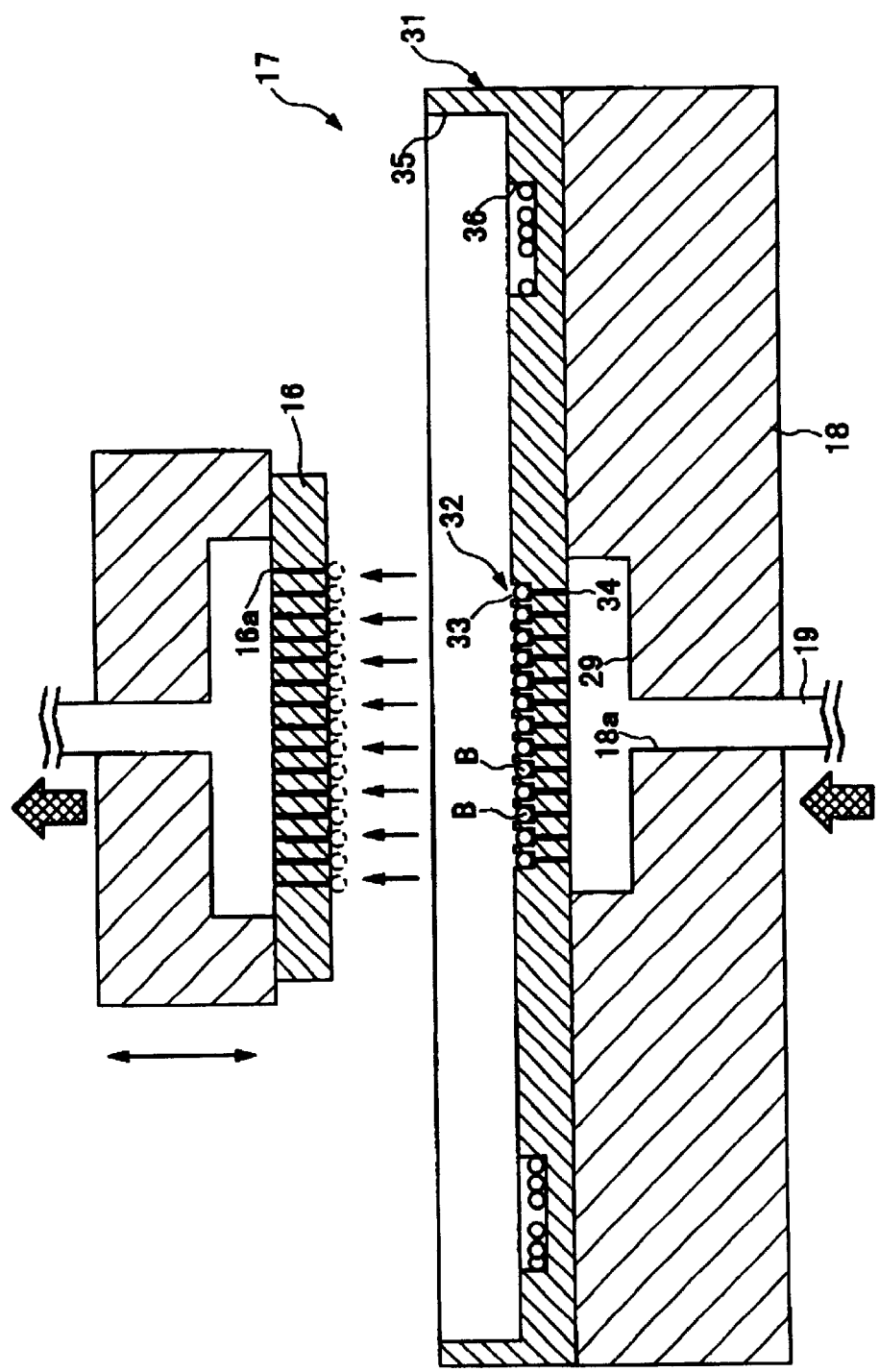
FIG. 13 is a sectional view of a ball adsorption unit and the ball supply unit of the micro-ball mounting apparatus for illustrating the embodiment of the method of lining up micro-balls according to the invention.
Figure 15:
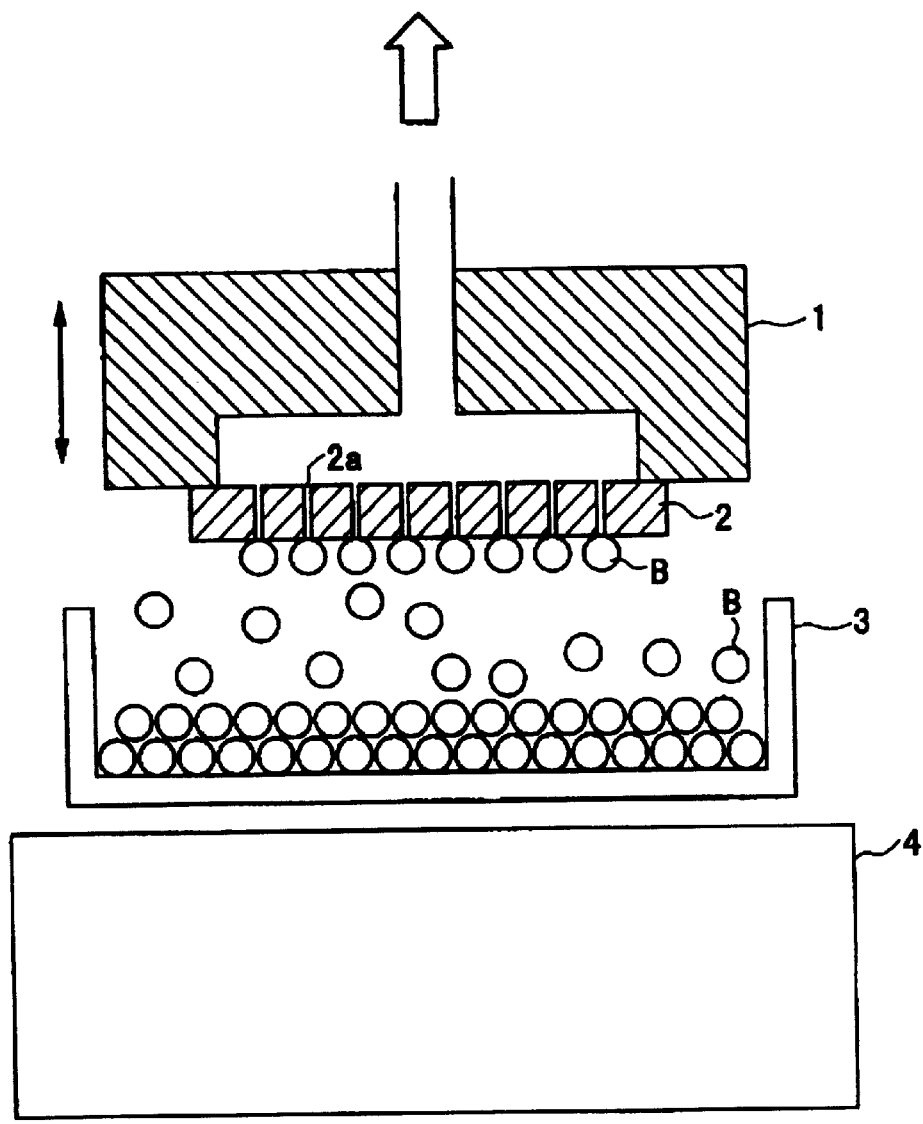
FIG. 15 is another sectional view illustrating an operation of supplying micro-balls to the adsorption head according to the conventional micro-ball mounting apparatus.

Then, as shown in FIG. 12, the excess of the micro-balls B for which an adsorptive force has been reduced due to the sucking force weakened by the regulator 25 is separated from the arraying jig 31 due to air vibration caused by the standing wave within the cylindrical body 43, concentrated in regions of the nodes 43a of the standing wave, and removed from the vicinity of the array holes 32, so that the excess of the micro-balls B is dropped in the groove 36 formed in such a way as to surround the array holes 32.

At this point in time, the sucking force of the suction unit 24 has already weakened. However, since the micro-balls B held by the ball holding hole part 33 making up the respective array holes 32 of the arraying jig 31 are well inside the ball holding hole parts 33, and securely held thereby, it does not happen that the micro-balls B held by the ball holding hole parts 33 are separated from the array holes 32 due to air vibration caused by the standing wave within the cylindrical body 43, and fly away even when the cylindrical body 43 passes over the arraying jig 31.

Step S5 (Step of Supplying the Micro-balls)

After the micro-balls B are lined up in the plurality of the array holes 32 so as to be set in order, and further, the excess of the micro-balls B is removed, the cylindrical body 43 is moved away from above the arraying jig 31, and the adsorption head 11 of the ball adsorption unit 10 is disposed above the arraying jig 31 of the ball supply unit 17 by the traveling mechanism 13, and further, is lowered by the hoisting and lowering mechanism 12 so as to be disposed at a position in close proximity to the top of arraying jig 31.

With the ball adsorption unit 10 in this condition, air is sucked in by the suction unit 15 through the adsorption holes 16a formed in the adsorption jig 16 for the adsorption head 11, and simultaneously, the compressed air source 22 is linked with the case 18 by the agency of the changeover valve 20, thereby causing air to be jetted out through the respective array holes 32 of the arraying jig 31.

As a result, the micro-balls B held by the ball holding hole part 33 of the respective array holes 32 are floated by air jetted out through the array holes 32, and moved to the vicinity of the adsorption holes 16a of the adsorption jig 16.

Meanwhile, since the adsorption head 11 is linked with the suction unit 15, and air is being sucked in, or vacuum is being applied, through the adsorption or section holes 16a of the adsorption jig 16, the micro-balls B in the vicinity of the adsorption holes 16a are adsorbed with certainty to the adsorption holes 16a of the adsorption jig 16.

Step S6 (Step of Mounting the Micro-balls)

As described in the foregoing, as soon as the micro-balls B are supplied to and adsorbed to the adsorption jig 16 of the adsorption head 11 of the ball adsorption unit 10, the adsorption head 11 of the ball adsorption unit 10 is disposed at a position above the work W held by the work holder 61 by the action of the hoisting and lowering mechanism 12 and the traveling mechanism 13, and further, is lowered by the hoisting and lowering mechanism 12, so that the micro-balls B adsorbed are mounted at predetermined points on the work W.

As described hereinbefore, with the above-mentioned embodiment of the method of lining up the micro-balls B on the arraying jig 31 according to the invention, using the micro-ball mounting apparatus, the cylindrical body 43 in the shape of a cylinder is disposed on the arraying jig 31 in a condition wherein the sucking force exerted through the respective array holes 32 is weakened after the micro-balls B are supplied to and adsorbed to the top of the arraying jig 31, the standing wave having the nodes thereof formed concentrically is generated inside the cylindrical body 43 by subjecting the cylindrical body 43 to ultrasonic vibration, and by moving the cylindrical body 43 horizontally over the arraying jig 31, the excess of the micro-balls B, sticking to the top of the arraying jig 31, is concentrated at the nodes of the standing wave so as to be removed. Hence, the micro-balls B can be lined up properly by ensuring removal of the excess of the micro-balls B, sticking to the top of the arraying jig 31, so that the micro-balls B lined up on the arraying jig 31 are adsorbed to the adsorption jig 16, and can be mounted on the work W with certainty.

Further, by sucking in air through the arraying jig 31, and adsorbing the micro-balls B thereto in a condition wherein the cylindrical body 43 is brought in close proximity to the top of the arraying jig 31 so as to cover the array holes 32 after the micro-balls B are supplied onto the arraying jig 31, a degree of vacuum in the space 43b between the arraying jig 31 and the cylindrical body 43 can be raised, and the air flow from the gap 43c between the cylindrical body 43 and the arraying jig 31 to the array holes 32 of the arraying jig 31 can be rendered stronger, thereby boosting suction of the micro-balls B through the array holes 32 to a large extent.

Furthermore, in a condition wherein a standing wave having nodes thereof concentrically formed is generated inside the cylindrical body 43 by subjecting the same to ultrasonic vibration, and the micro-balls B on the arraying jig 31 are caused to be concentrated at the nodes of the standing wave, the cylindrical body 43 is moved horizontally over the arraying jig 31. Accordingly, it is possible to distribute the micro-balls B evenly into the respective array holes 32 of the arraying jig 31 so as to be lined up properly.

As is evident from the foregoing description, with the method of lining up the micro-balls according to the invention, the following advantageous effects can be obtained.

With the method of lining up the micro-balls in accordance with the first aspect of the invention, the cylindrical body in the shape of a cylinder is disposed on the arraying jig after the micro-balls are supplied to and adsorbed to the top of the arraying jig, the standing wave, having nodes thereof formed concentrically, is generated inside the cylindrical body by subjecting the cylindrical body to ultrasonic vibration, and by moving the cylindrical body horizontally over the arraying jig while keeping up the above-mentioned condition, the excess of the micro-balls, sticking to the top of the arraying jig, can be concentrated at the nodes of the standing wave, and removed. Hence, the micro-balls can be lined up properly by ensuring removal of the excess of the micro-balls, sticking to the arraying jig.

As a result, the micro-balls lined up on the arraying jig can be adsorbed to the adsorption jig, and can be mounted on a work with certainty.

Further, in accordance with the first aspect of the invention, the cylindrical body in the shape of a bottomed cylinder, having an opening at an end thereof, is brought in close proximity to the top of the arraying jig so as to cover the array holes after the micro-balls are supplied onto the arraying jig, and by sucking in air through the array holes so as to adsorb the micro-balls thereto while keeping up the above-mentioned condition, a degree of vacuum in the space between the arraying jig and the cylindrical body can be raised, and an air flow from the gap between the cylindrical body and the arraying jig to the array holes of the arraying jig can be rendered stronger, thereby boosting suction of the micro-balls through the array holes to a large extent.

Furthermore, with these features mentioned above, the standing wave having the nodes thereof concentrically formed can be generated inside the cylindrical body by subjecting the cylindrical body to ultrasonic vibration, so that the micro-balls on top of the arraying jig are concentrated at the nodes of the standing wave, and by moving the cylindrical body horizontally over the arraying jig while keeping up the above-mentioned condition, the micro-balls can be evenly distributed into the respective array holes of the arraying jig, and can be lined up properly.

What is claimed is:

1. A method of lining up micro-balls whereby the micro-balls to be formed into bumps are lined up on an arraying jig, and the micro-balls lined up are provided to a transfer jig; said method comprising:

a micro-ball receiving step for causing the micro-balls to be maintained at a plurality of array holes by supplying the micro-balls onto the arraying jig having the plurality of array holes formed therein and by suction of air through the array holes;

a micro-ball distribution step for distributing the micro-balls placed on the arraying jig into the respective array holes;

an excessive micro-ball removal step for removing an excess of the micro-balls from the arraying jig; and a micro-ball supply step for supplying the micro-balls to the transfer jig of a transfer head;

wherein, in the excessive micro-ball removal step, a cylindrical body is disposed over the arraying jig, a standing wave having nodes thereof formed concentrically by air vibration is generated from inside the cylindrical body by subjecting the cylindrical body to ultrasonic vibration, and the excess of the micro-balls at the arraying jig is concentrated at the nodes of the standing wave before removal of the excess micro-balls by moving the cylindrical body horizontally over the arraying jig.

2. The method of lining up micro-balls according to claim 1, wherein the cylindrical body is formed in the shape of a cylinder having an opening at a bottom end thereof facing the arraying jig, and the micro-ball receiving step includes bringing the cylindrical body in close proximity to the top of the arraying jig so as to cover the array holes after the micro-balls are supplied onto the arraying jig, and in that condition, the micro-balls are capable of movement into the array holes by suction of air through the array holes.

3. The method of lining up micro-balls according to claim 1, wherein, in the micro-ball distribution step, the standing wave having the nodes thereof concentrically formed by air vibration is generated from inside the cylindrical body by ultrasonic vibration, the micro-balls on the arraying jig being concentrated at the nodes of the standing wave, and, while continuing the air vibration, moving the cylindrical body horizontally over the arraying jig.

4. A method of arranging micro-balls, comprising the steps of:

feeding micro-balls to an arraying jig having a plurality of array holes for receiving the micro-balls therein;

applying suction to the arraying jig to maintain the micro-balls in the array holes;

distributing the micro-balls placed on the arraying jig into the array holes;

removing an excess of the micro-balls from the arraying jig and ensuring that the remaining micro-balls are properly lined up in the plurality of array holes;

applying suction to a transfer jig to receive the micro-balls from the arraying jig; and transferring the micro-balls from the transfer jig to a work surface.

5. The method of arranging micro-balls of claim 4, wherein the step of distributing the micro-balls includes applying air vibration to the micro-balls on the arraying jig.

6. The method of arranging micro-balls of claim 4, wherein the step of distributing the micro-balls includes the steps of:

providing a body with an ultrasonic vibrator above the arraying jig;

operating the ultrasonic vibrator to generate a standing wave having nodes to concentrate micro-balls at points of the nodes by air vibration; and moving the body so that the nodes are shifted and micro-balls move into the arraying holes and maintained by suction therein.

7. The method of arranging micro-balls of claim 6, wherein the step of removing an excess of the micro-balls includes the steps of:

after distributing the micro-balls, reducing the suction applied in the array holes; and operating the ultrasonic vibrator to generate the standing wave while moving the body across the arraying jig so that excess micro-balls are separated from the arraying jig due to air vibration caused by the standing wave from the body, and removed from a vicinity of the array holes.

8. The method of arranging micro-balls of claim 4, wherein the step of removing an excess of the micro-balls includes the steps of:

reducing the suction applied in the array holes;

providing a body with an ultrasonic vibrator above the arraying jig; and operating the ultrasonic vibrator to generate a standing wave while moving the body across the arraying jig so that excess micro-balls are separated from the arraying jig due to air vibration caused by the standing wave from the body, and removed from a vicinity of the array holes.

9. The method of arranging micro-balls of claim 4, wherein the step of applying suction to receive the micro-balls at the transfer jig includes the steps of:

providing the transfer jig with transfer holes;

positioning the transfer jig of the micro-ball transfer head above the arraying jig;

lowering the transfer head to a position adjacent the arraying jig;

outputting air pressure through the array holes of the arraying jig to move the micro-balls toward the transfer jig; and applying suction through the transfer holes to receive and maintain the micro-balls against the transfer holes.

10. The method of arranging micro-balls of claim 9, wherein the step of transferring the micro-balls includes the steps of:

moving the transfer jig to a position above the work surface;

lowering the transfer jig so that the micro-balls are positioned on the work surface; and stopping the application of suction from the transfer holes.

11. The method of claim 4, wherein the array holes of the arraying jig each include a ball holding hole section for receiving the entirety of a corresponding one of the micro-balls therein.

12. An apparatus for arranging micro-balls whereby the micro-balls are positioned on an arraying jig, comprising:

a ball feeding unit for feeding micro-balls;

a ball supply unit for receiving micro-balls from the ball feeding unit, said ball supply unit including an arraying jig having a plurality of array holes for receiving micro-balls therein, said ball supply unit including a suction unit connected to the array holes to apply suction to maintain micro-balls in the array holes;

a ball distribution unit including a cylindrical body with an ultrasonic vibrator for placement above the arraying jig, wherein air vibration from operation of said ultrasonic vibrator and movement of said cylindrical body distribute the micro-balls into the array holes; and a ball transfer unit including a micro-ball transfer head having a transfer jig with transfer holes for positioning above said arraying jig, the transfer holes connected to a suction device so that said transfer jig receives micro-balls from the arraying jig for subsequent transfer to a work surface.

13. The apparatus for arranging micro-balls of claim 12, wherein said ball supply unit includes a traveling mechanism for enabling reciprocating movement of said arraying jig and a compressed air source capable of providing air flow through the array holes to assist in the transfer of micro-balls from said array jig to said transfer jig.

14. The apparatus for arranging micro-balls of claim 12, wherein the array holes of said arraying jig each include a ball holding hole section for receiving substantially the entirety of the micro-balls.

15. The apparatus for arranging micro-balls of claim 12, wherein said ball distribution unit includes a traveling mechanism for enabling reciprocating movement of said cylindrical body and a hoisting and lowering mechanism for raising and lowering said cylindrical body.

16. The apparatus for arranging micro-balls of claim 12, wherein said ball transfer unit includes a traveling mechanism for enabling reciprocating movement of said transfer head and a hoisting and lowering mechanism for raising and lowering said transfer head.

17. The apparatus for arranging micro-balls of claim 12, wherein said ball feeding unit includes a traveling mechanism and an ultrasonic vibration generator for outputting micro-balls from a ball bin through a feeding tube to said ball supply unit, said ball feeding unit including a weight detection sensor to detect the quantity of micro-balls fed to said ball supply unit.

* * * * *